(12) United States Patent
Paeschke et al.

(10) Patent No.: US 8,899,486 B2
(45) Date of Patent: Dec. 2, 2014

(54) DATA CARRIER WITH A CHIP AND A PLURALITY OF SENSORS

(75) Inventors: Manfred Paeschke, Basdorf (DE); Kim Nguyen, Berlin (DE); Oliver Muth, Berlin (DE); Michael Knebel, Berlin (DE); Mathias Wagner, Alvesen-Rosengarten (DE); Thomas Wille, Hamburg (DE)

(73) Assignee: Quotainne Enterprises LLC, Wilmington, DE (US)

( * ) Notice: Subject to any disclaimer, the term of this patent is extended or adjusted under 35 U.S.C. 154(b) by 1652 days.

(21) Appl. No.: 11/721,433

(22) PCT Filed: Dec. 6, 2005

(86) PCT No.: PCT/IB2005/054081
§ 371 (c)(1),
(2), (4) Date: Jul. 28, 2009

(87) PCT Pub. No.: WO2006/061780
PCT Pub. Date: Jun. 15, 2006

(65) Prior Publication Data
US 2009/0294535 A1    Dec. 3, 2009

(30) Foreign Application Priority Data

Dec. 10, 2004  (EP) .................................... 04106463

(51) Int. Cl.
| | | |
|---|---|---|
| *G06K 19/07* | (2006.01) |
| *G06K 19/073* | (2006.01) |
| *G06K 19/077* | (2006.01) |
| *G06K 7/10* | (2006.01) |
| *H01L 31/0232* | (2014.01) |
| *G06K 19/14* | (2006.01) |
| *H01L 31/0216* | (2014.01) |

(52) U.S. Cl.
CPC ...... *G06K 19/07749* (2013.01); *G06K 19/0723* (2013.01); *G06K 19/07345* (2013.01); *H01L 31/02322* (2013.01); *G06K 19/0716* (2013.01); *G06K 19/145* (2013.01); *G06K 19/073* (2013.01); *G06K 7/1097* (2013.01); *G06K 19/0728* (2013.01); *H01L 31/02162* (2013.01); *G06K 19/077* (2013.01)
USPC ...................... 235/492; 340/572.1; 340/572.4

(58) Field of Classification Search
USPC ............. 235/487, 492, 440, 454, 439; 340/572.1, 572.4, 539.11, 10.1, 10.4, 340/10.5, 5.61, 12.51; 250/226; 359/359, 359/491.01, 588, 590, 788
See application file for complete search history.

(56) References Cited

U.S. PATENT DOCUMENTS

| | | | | |
|---|---|---|---|---|
| 3,426,212 A | * | 2/1969 | Klaas ............................ 250/226 |
| 5,825,045 A | * | 10/1998 | Koenck et al. ................ 250/566 |

(Continued)

OTHER PUBLICATIONS

"Filter." The Photonics Dictionary, 45th ed. 1999.*

(Continued)

Primary Examiner — Michael G Lee
Assistant Examiner — Suezu Ellis
(74) Attorney, Agent, or Firm — David C. Kellogg (57) ABSTRACT

The invention relates to a data carrier (100) with a chip (10) which stores energy (13) as well as information for contact-bound or contactless inductive communication, and with a plurality of excitable chip sensors (11) integrated in the chip (10), which, after excitation (12), pass on a signal (18) to a CPU (19) of the chip (10), in which the signal (18) is processed. The invention is characterized in that, independently of storing energy (13) as well as information by the chip (10), the excitation (12) is specifically adjustable by the chip (10) for the purpose of additionally storing information and is adaptable to the requirements of processing the signal (18) in the CPU (19).

4 Claims, 6 Drawing Sheets

(56) References Cited

U.S. PATENT DOCUMENTS

| | | | |
|---|---|---|---|
| 5,874,724 A | 2/1999 | Cato | |
| 6,294,997 B1 | 9/2001 | Paratore et al. | |
| 6,802,008 B1 * | 10/2004 | Ikefuji et al. | 726/20 |
| 7,154,395 B2 * | 12/2006 | Raskar et al. | 340/572.4 |
| 7,425,899 B2 * | 9/2008 | Stewart et al. | 340/572.4 |
| 7,652,557 B2 * | 1/2010 | Kantrowitz et al. | 340/10.34 |
| 7,671,721 B2 * | 3/2010 | Seppa | 340/10.34 |
| 7,791,481 B2 * | 9/2010 | Landt et al. | 340/572.1 |
| 7,813,175 B2 * | 10/2010 | Kim | 365/185.05 |
| 2002/0031838 A1 | 3/2002 | Meinhart et al. | |
| 2002/0127481 A1 * | 9/2002 | Chen et al. | 430/7 |
| 2002/0186145 A1 | 12/2002 | Chainer et al. | |
| 2004/0012496 A1 | 1/2004 | De Souza et al. | |
| 2004/0052203 A1 | 3/2004 | Brollier | |
| 2004/0062294 A1 | 4/2004 | Clemens et al. | |
| 2004/0100834 A1 | 5/2004 | Waters | |
| 2004/0181516 A1 * | 9/2004 | Ellwanger et al. | 707/3 |
| 2004/0246099 A1 * | 12/2004 | Tuttle | 340/10.1 |
| 2005/0040241 A1 * | 2/2005 | Raskar | 235/492 |
| 2005/0116813 A1 * | 6/2005 | Raskar | 340/10.1 |
| 2005/0163511 A1 * | 7/2005 | Cicchiello | 398/170 |
| 2006/0033325 A1 * | 2/2006 | Maruvada et al. | 283/95 |
| 2006/0114377 A1 * | 6/2006 | Yen et al. | 349/106 |
| 2006/0164291 A1 * | 7/2006 | Gunnarsson | 342/51 |
| 2007/0040683 A1 * | 2/2007 | Oliver et al. | 340/572.1 |
| 2007/0222591 A1 * | 9/2007 | Kimata | 340/539.26 |
| 2009/0009288 A1 * | 1/2009 | Fogg | 340/10.1 |
| 2009/0051497 A1 * | 2/2009 | Miyaso | 340/10.4 |
| 2011/0091216 A1 * | 4/2011 | Addy | 398/115 |
| 2012/0000985 A1 * | 1/2012 | Bove | 235/492 |

OTHER PUBLICATIONS

Britton, C.L; et al "Battery-Powered, Wireless MEMS Sensors for High-Sensitivity Chemical and Biological Sensing" Oak Ridge National Laboratory, The University of Tennessee, Knoxville 2002.
Y. Haghiri/Th. Tarantino, "Vom Plastik zur Chipkarte" ("From plastic to chip card"), Carl Hanser Publishers, Munich, Vienna, 1999; Chapter (2): "Kartenkorper" (Card bodies) and Chapter (3): "Herstellungsformen fur Kartenkorper" ("Methods of manufacturing card bodies").

* cited by examiner

DATA CARRIER WITH A CHIP AND A PLURALITY OF SENSORS

The invention relates to a data carrier with a chip, which stores energy as well as information for contact-bound or contactless inductive communication, and with a plurality of excitable sensors integrated in the chip, which, after excitation, pass on a signal to a CPU of the chip, in which the signal is processed.

The invention also relates to a method of communicating by means of chips integrated in data carriers, in which energy as well as information from a chip is stored for contact-bound or contactless inductive communication, and in which a plurality of sensors integrated in the chip is excited, which then pass on a signal to a CPU for the purpose of processing.

Data carriers with a chip are widely known in the art and form part of, for example, machine-readable travel documents (MRTD) and are usually equipped with a chip on a semiconductor basis which provides the possibility of both storing and processing complex (biometrical) information.

Data carriers with a chip are also used in value and security documents such as chip cards, smart cards, personal documents, passports, driving licences, checks and banknotes. Particularly chip cards have found their way in more and more new fields of daily life and have meanwhile become a natural part of modern life, with a chip module being integrated in the card body of the chip card. The card body may be made of different materials. Suitable materials are, for example, polyvinylchloride, polycarbonate, acrylbutadiene styrol, polyethylene terephthalate, (thermoplastic) polyurethane (T)PU or also paper and cardboard in which, however, also compound materials/laminates of synthetic material with paper, photopaper or special materials such as Tyvek of Dupont are interesting. The constituents of a card are referred to as card elements. Important card elements are, for example, foils and printing colors or inks. Card elements such as MLI (multiple laser image), OVI (optical variable ink), UV colors or fluorescent colors are also important. There are various methods of manufacturing data carriers, such as particularly the lamination technique and the injection molding technique. An extensive description of materials and manufacturing methods for data carriers can be found in, for example, the book by Y. Haghiri/Th. Tarantino, "Vom Plastik zur Chipkarte" ("From plastic to chip card"), Carl Hanser Publishers, Munich, Vienna, 1999; Chapter (2): "Kartenkörper" ("Card bodies") and chapter (3): "Herstellungsformen für Kartenkörper" ("Methods of manufacturing card bodies").

The conventional chip modules built in the card body are substantially independent of the type of material surrounding them. It does not "matter" to a chip whether it is incorporated in a PVC injection-molded card, a PC compound or a PET self-adhesive label. The communication or data exchange with the chip is realized either in a contact-bound or a contactless way (RFID technology), which are among the conventional possibilities. In the RFID technology, the communication is established by means of magnetic or electromagnetic fields.

An MRTD-integrated chip module is enabled/disabled in a conventional manner by means of a data exchange between the chip module and a testing station, which can also be realized in the RFID technology. In this case, the testing station "proves" to the chip that it possesses certain secret information. This knowledge in turn proves to the chip that the testing station is, for example, authorized to read the chip contents. This process is also referred to as conventional authentication.

Present-day chips are also equipped with a plurality of on-chip sensors. These on-chip sensors provide the possibility of appropriate operation of the chip by monitoring external ambient parameters such as temperature, energy supply and incidence of light.

Such a plurality of on-chip sensors is known from, for example, US 2002/0,186,145 A1. The known sensors are additional constituents of a chip in a smart card (page 2, column 1, lines 2 to 8) and are used to detect changes of a product or its ambience (page 1, column 2, [0013]).

Furthermore, it is known from the prior art that a plurality of on-chip sensors may comprise, for example, a light sensor, a temperature sensor, a frequency sensor and a further sensor which, when excited, pass on a signal to the CPU of the chip in which the signal is processed. Usually, the sensors communicate with the CPU in one of two possible ways. One way is to trigger an exception which is appropriately processed by the operating system (and, for example, repeats a computation, stops a computation or tests computation results in a detailed manner). Another way is to trigger a warm reset by a sensor, i.e. the CPU is caused to completely interrupt the program it is processing, and to repeat it again from the start. This is the more drastical reaction and is usually applied for sensors which are considered to be critical.

The chips with a plurality of on-chip sensors known from the prior art consequently show that sensors integrated in chips are mainly used for the purpose of detecting common changes of external parameters so as to communicate with the CPU by means of exceptions and warm resets. Consequently, the possibilities of the chips performing given and specific processes and operations in the CPU, which extend beyond the conventional possibilities based on, for example, the RFID technology and require, for example, specific, complex optical signals, are of course limited. In accordance with the state of the art, the processing of conventional RFID signals together with complex signals resulting from specific, complex sensor excitations and leading to new and complex processes cannot be performed in the chip.

It is therefore an object of the invention to provide a data carrier with a chip and a plurality of chip sensors in which the CPU does not only process the conventional signals resulting from contact-bound or contactless communication but is also activated for given, more complex processes requiring excitation of the chip sensors.

This object is achieved by the characteristic features defined in claim 1.

The invention is based on the recognition that the CPU of the chip is not only made suitable for reception of and activation by the conventional signals occurring in contact-bound or contactless inductive communication but also for the signals supplied in a physically independent manner by the chip sensors that are integrated in the chip. In this way, the conventional possibilities of communication are accompanied by a further possibility of communicating with the chip, which is particularly suitable for transmitting complex signals required for a specific excitation to the CPU. The CPU of the chip processing the complex signals can then activate the chip for further processes which extend beyond, for example, the conventional authentication. For example, the signals transmitted through the conventional communication modes and the signals transmitted by the chip sensors through separate physical connections can also be processed in a combined manner in the CPU so as to trigger further processes in the chip.

An advantageous embodiment of the data carrier according to the invention is defined in which the plurality of chip sensors communicates with a filter material in which the excitation is specifically adjustable and is adaptable to the requirements of processing the signal in the CPU. This ensures that given material-dependent chemical/physical phenomena can be utilized for the specific excitation. By using the filter material which communicates with the chip sensors, a chemical-physical "filtering" is created to a certain extent which allows only given, specific excitations of the chip sensors and thus also ensures that the chip only functions in the "correct" material ambience. In this way, material properties are combined with the chip to one functional unit. A chip functions only in the "correct" material environment. Conversely, in such a controlled material environment, the hardware properties of the chips can be verified by means of a defined hardware signature.

Data carriers with chips are often used in, for example, chip cards, personal documents and checks whose materials can thus be used as filter material.

It is advantageous that the document material is formed as a material imprint or as an additive.

A further preferred embodiment of the invention is characterized in that the plurality of chip sensors includes a photosensor detecting the excitation of a pulsed laser beam. Different optical excitation profiles are created because the photo sensor detects the excitation of the pulsed laser beam. Excitation profiles thus formed are suitable for transmitting complex information to the chip.

Advantageously, the CPU performs a combined processing operation on a signal of the contact-bound or contactless inductive communication and the signal supplied by the plurality of chip sensors. In such a combined communication, a binary code can be divided into two information paths and composed to the actual code in the CPU. In this way, for example, a logic "0" can be transmitted by using the conventional information path and triggering a warm reset. A logic "1" is transmitted by triggering a photosensor and thus a warm reset whose photosensor origin is characterized in a status variable. By repeatedly querying the status variables, the CPU ultimately composes the information to be transmitted from the single pieces of information.

An advantageous embodiment of the data carrier according to the invention is defined in which the plurality of chip sensors includes a photosensor and the filter material consists of card material which is opaque at wavelengths of less than 800 nm and transparent at wavelengths of 800 to 1100 nm, and of a UC converter adjoining the card material, as well as an interference filter laminate adjoining the UC converter, and in which a pulsed laser beam first penetrates through the card material and then penetrates the UC converter. In accordance with ISO 7810, conventional card materials are transparent only in the NIR range at wavelengths between 800 and 1100 nm so that a pulsed laser beam in this wavelength range can specifically excite the photosensor and produce different optical excitation profiles, with the result that the correspondingly programmed CPU processes complex signals which, together with the "customary" RFID signal, activate the chip for further processes.

A useful variant of the data carrier according to the invention is defined in which the plurality of chip sensors includes a photosensor and the filter material consists of the card material and a matrix adjoining the card material, which matrix generates modulated luminescences, and in which a pulsed laser beam first penetrates through the card material and then penetrates the matrix. Such a specific, pulsed excitation triggers routines which are distinguished from the conventional exception routines and lead to complex operations in the CPU.

Alternatively, the plurality of chip sensors includes at least two identical or different photosensors whose filter material is different, in which the filter material consists of the card material, and in which a pulsed laser beam penetrates through the filter material and excites the photosensors which separately pass on a signal to the CPU. This has the advantage that the information can be divided into different optical wavelengths. This may be used, for example, for implementing a ternary logic.

A practicable variant of the data carrier according to the invention is defined in which the plurality of chip sensors includes a photosensor and the filter material consists of a light converter which shifts wavelengths, and of card material adjoining the light converter, which card material is transparent in a wavelength range between 800 and 1100 nm, and in which a pulsed laser beam penetrates the light converter only. Such a filter material has the advantage that it consists of only two layers, namely of the light converter and the card material and can nevertheless generate complex optical excitation profiles.

The data carrier according to the invention is advantageously integrated in a value or security document. This takes the fact into account that data carriers are often used in value and security documents.

Moreover, the data carrier according to the invention can be used in a method of communicating with chips integrated in data carriers, in which energy as well as information from a chip is stored for contact-bound or contactless inductive communication and, independently thereof, a plurality of chip sensors integrated in the chip is excited, which then pass on a signal to a CPU for the purpose of processing, the excitation being specifically adjusted by the chip for the purpose of additional storage of information and being adapted to the requirements of processing in the CPU.

The chip sensors can be caused to communicate with a filter material in which the excitation is specifically adjusted and adapted to the requirements of processing the signal in the CPU, while a photosensor detecting the excitation of a pulsed laser beam is integrated in the plurality of chip sensors.

These and other aspects of the invention are apparent from and will be elucidated with reference to the embodiments described hereinafter.

Figure 1:
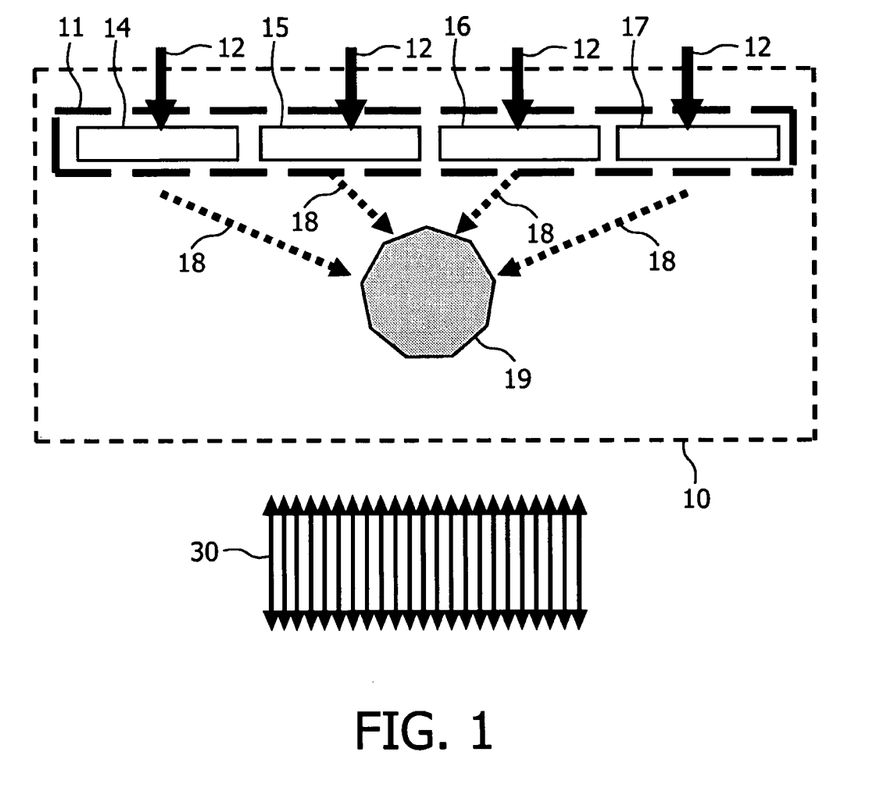
FIG. 1 shows diagrammatically a plurality of conventional chip sensors.

FIG. 1 shows a plurality of conventional chip sensors 11. The chip sensors 11 provide the possibility of appropriate operation of the chip 10 by monitoring external ambient parameters such as, for example, temperature, power supply voltage, clock frequency and light incidence. The plurality of chip sensors 11 comprises a light sensor 14, a temperature sensor 15, a frequency sensor 16 and a further sensor 17. In the case of excitation 12 of the chip sensors 11, the chip sensors 11 pass on a signal 18 to the CPU 19 of the chip 10 in which the signal 18 is processed. There are essentially two methods of processing such a signal 18. In one method, the CPU 19 generates an "exception" signal which is further processed by the operating system of the chip 10. After introduction into an inductive electromagnetic field 30, the operating system of the chip 10 expects a well-defined sequence, triggered by the chip sensors 11, of various exception signals. The light sensor 14 may thus first trigger an exception signal and the temperature sensor 15 may subsequently trigger an exception signal. Only after the frequency sensor 16 has also finally triggered an exception signal does the chip 10 enable the conventional communication via the contact-bound or contactless interface, and the conventional authentication can be performed.

A further method is a warm reset of the chip triggered by the CPU 19. After introduction into an inductive electromagnetic field 30, the operating system of the chip 10 expects a well-defined sequence of warm resets. The first warm reset triggers the light sensor 14 and the second warm reset triggers the temperature sensor 15. Finally, a third warm reset is triggered by the frequency sensor 16. After each warm reset, the operating system of the chip 10 updates a test variable stored in the EEPROM. The conventional communication via the contactless interface is enabled and the conventional authentication can be performed only when this variable has reached a given value.

Figure 2:
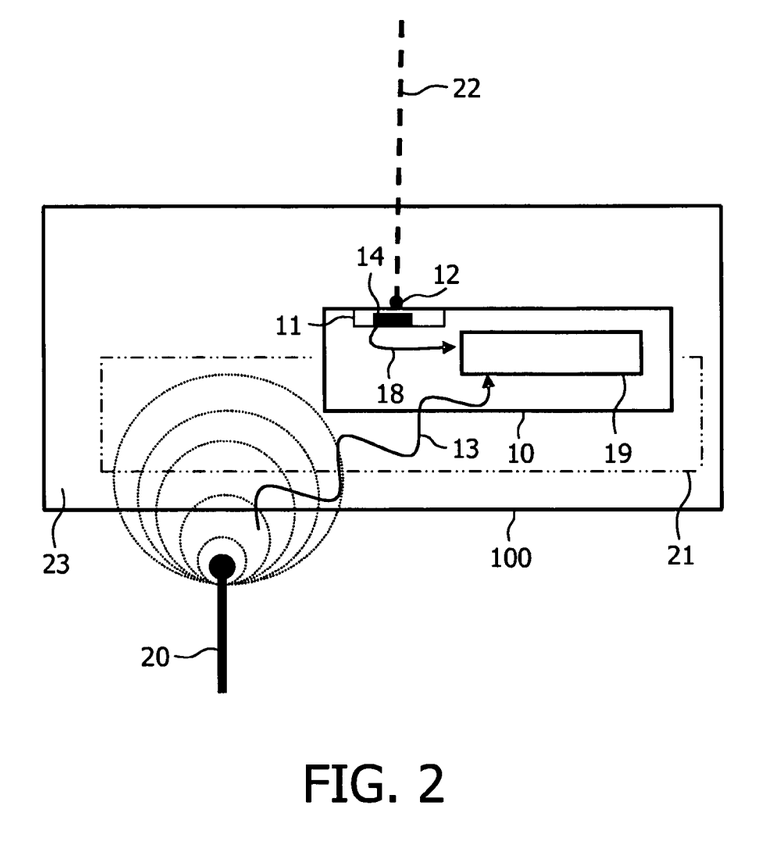
FIG. 2 shows diagrammatically a card according to the invention with a chip and a plurality of chip sensors.

The data carrier 100 according to the invention, shown as a chip card in FIG. 2, comprises the chip 10, and the plurality of chip sensors 11 comprises a photosensor 14 which detects the excitation 12 of a pulsed laser beam 22 which is modulated. The data carrier 100 consists of card material 23 through which the pulsed laser beam 22 can penetrate. Conventional card materials are transparent in the NIR range of 800 to 1100 nm so that the excitation 12 of a pulsed laser beam 22 is specifically adjustable in this wavelength range and is adaptable to the requirements of processing the signal 18 in the CPU 19. Defined transparencies can usually be adjusted by selecting synthetic materials for the card material 23 with the corresponding additives. Different optical excitation profiles are created in that the photosensor 14 detects the excitation 12 of the pulsed laser beam 22. Such excitation profiles are suitable for transmitting complex information to the chip 10. The excitation of the photosensor triggers an exception signal and thus represents an input command for the CPU 19. The CPU 19 is programmed in such a way that it does not only expect the "customary" RFID signal but also an exception signal from the photosensor 14 and thus additively activates the chip 10 for further processes. The chip 10 stores energy 13 as well as information which are coupled into the chip 10 via a conventional antenna 20 and the antenna periphery 21 so as to generate the RFID signal. It is to be noted that this embodiment as well as the other embodiments can also be used within the scope of contact technologies, i.e. the energy and information can also be transmitted via conventional contact.

Figure 3:
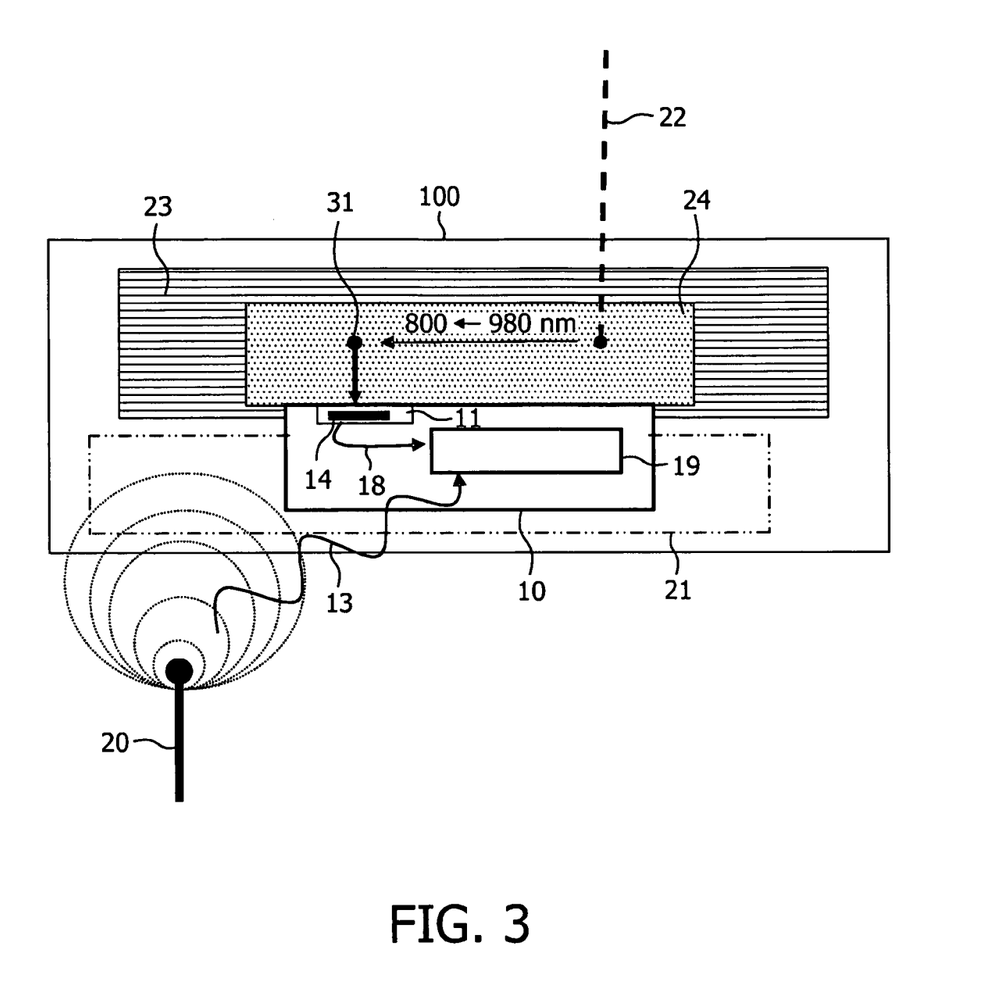
FIG. 3 shows diagrammatically the plurality of chip sensors according to the invention with a filter material provided with a matrix.

FIG. 3 shows a plurality of chip sensors 11 with a photosensor 14. The filter material consists of the card material 23 and of a matrix 24 adjoining the card material 23, which matrix generates modulated luminescences, in which a pulsed laser beam 22 first penetrates through the card material 23 and then penetrates the matrix 24.

The card material 23 is adjusted in such a way that it completely absorbs light at wavelengths of less than 850 nm and is transparent at wavelengths of more than 850 nm in the NIR range. In known manner, both energy 13 and information is coupled into and stored on the chip 10 via an antenna 20 and an antenna periphery 21 so as to generate the RFID signal. Independently thereof, the pulsed laser beam 22 irradiates the matrix 24 with an emission at 980 nm, while a UP conversion process generates a luminescence at 800 nm (670, 550 or 430 nm). This in situ generated light (luminescence emission 31) is incident on the photosensor 14 and after excitation 12 triggers a signal 18 in the form of an exception signal, i.e. it represents an input command for the CPU 19. The luminescence dynamics of the UP conversion materials should be chosen to be such that the modulation of the pulsed laser beam 22 can be "passed on" so that a modulated luminescence reaches the photosensor 14 and complex optical information can thus be coupled in. This means that a simple continuous excitation of the photosensor 14, for example, the customary exception routine, deactivates the chip. A defined pulsed excitation, however, triggers other routines which lead to complex operations in the CPU 19. The CPU 19 is programmed in such a way that it does not only expect the "customary" RFID signal but also defined exception signals from the photosensor 14 so as to reach a complex result during the processing operation. Moreover, the matrix 24 may be formed with special material (combinations) so that, for example, other optical conversion processes such as photoluminescence or invisible Stokes luminescence can be utilized. The matrix 24 may also be applied prior to laminating the compound material of the card by means of known printing techniques such as silkscreen printing, rotogravure, flexoprinting, offset, letter set, ink jet, thermotransfer etc. or the UC pigment may be incorporated when housing the chip in the epoxy resin substance so that only a pulsed laser beam 22 is suitable and the intensity of pulsed "NIR light" is not sufficient to generate adequate luminescences.

Figure 4:
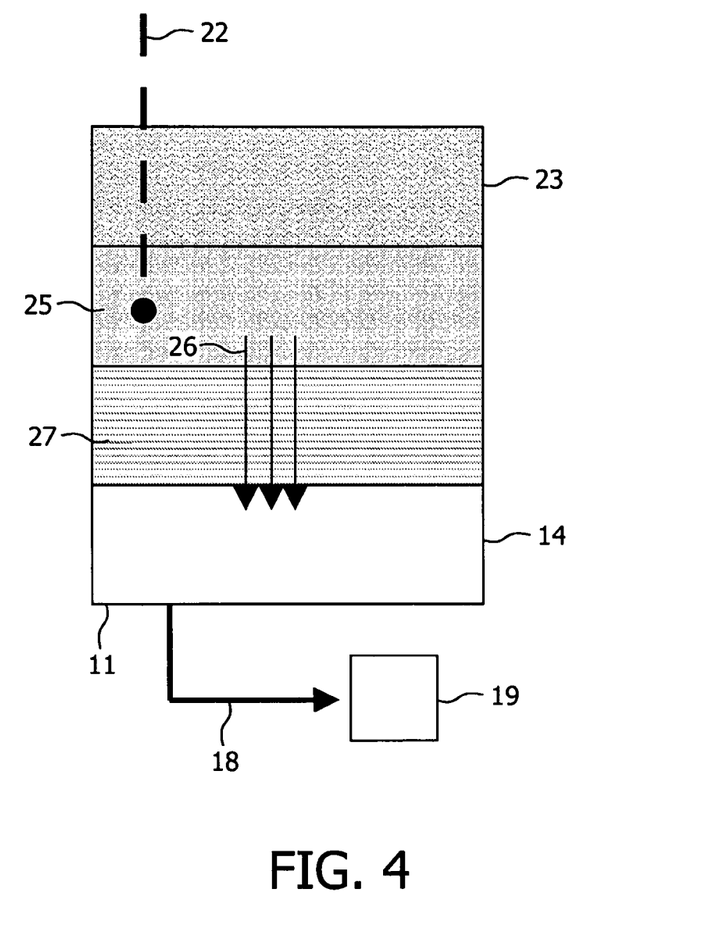
FIG. 4 shows diagrammatically the plurality of chip sensors according to the invention with a filter material provided with a UC converter and an interference filter laminate.

The chip sensors 11 shown on an explicitly larger scale in FIG. 4 communicate with filter material which consists of card material 23 which is opaque at wavelengths of less than 800 nm and transparent at wavelengths between 800 and 1100 nm, and of a UC converter 25 adjoining the card material 23, as well as of an interference filter laminate 27 adjoining the UC converter, in which the pulsed laser beam 22 penetrates through the card material 23 and penetrates the UC converter 25. The UC converter 25 which is printed on the rear side of the card material 23 consists of, for example, ytterbium and holmium-doped gadolinium oxysulphide as a phosphor and is favorably formed in such a way that the UC radiation 26 is essentially directed downwards in the direction of the photosensor 14 in the form of a Si photosensor and is used as excitation. The interference filter laminate 27 has very sharp absorption edges so as to absorb light of wavelengths between 800 and 1100 nm. Due to the phosphors used, the UC converter generates an emission at 550 nm. The luminescence can only spread in the direction of the Si photosensor where it triggers a signal 18 which is passed on to the CPU 19. However, the laser beam required for excitation would be absorbed in the filter laminate layer at the latest and could thus not activate the Si photosensor.

Figure 5:
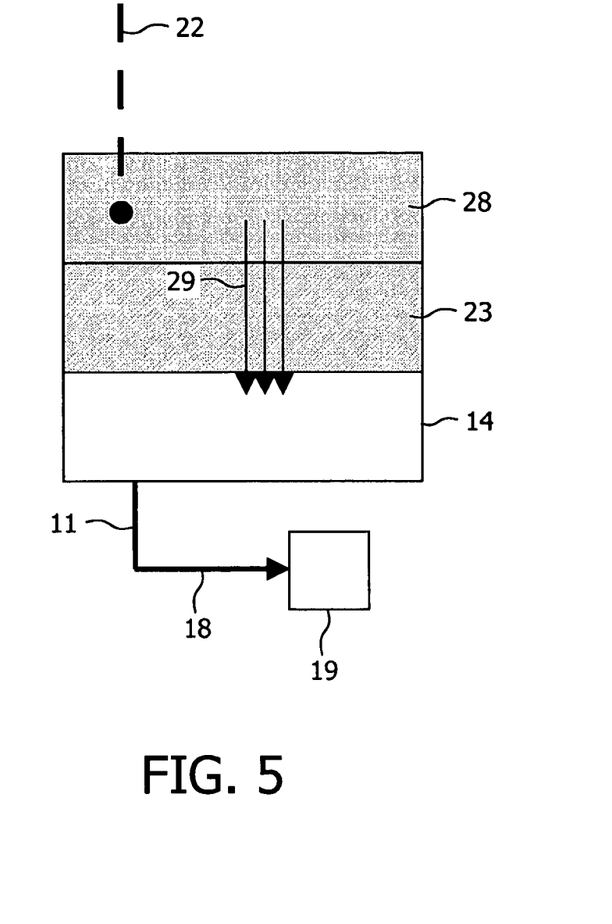
FIG. 5 shows diagrammatically the plurality of chip sensors according to the invention with a filter material provided with a light converter.

FIG. 5 shows a plurality of chip sensors 11 including a photosensor 14 in the form of a Si photosensor, with filter material consisting of a light converter 28 shifting wavelengths and card material 23 adjoining the light converter 28, which is transparent in a wavelength range between 800 and 1100 nm, and in which a pulsed laser beam 22 penetrates the light converter 28. The light converter 28 consists of (chromium) lanthanoide-doped yttrium vanadates (yttrium phosphates, yttrium borates) absorbing red light and generating an emission in the NIR range. The original excitation light is thus shifted as a long wave. In the simplest case, the light converter is printed by means of a conventional printing method or put in front as a foil additive. Other materials such as, for example, chromium and neodymium-doped yttrium aluminum garnets defined by the general formula YAG:Cr,Nd can also be used as light converters. In accordance with ISO 7810, the card material 23 adjoining the light converter 28 is only transparent in the NIR range of 800 to 1100 nm. The light converter 28 absorbs a pulsed laser beam 22 between 800 and 1100 nm substantially completely so that the pulsed laser does not reach the photosensor 14. However, red laser light (630-690 nm) triggers a luminescence 29 between 900 and 1000 nm dependent on the design of the light converter 28, which luminescence reaches the photosensor 14 through the card material 23 and serves as excitation for the photosensor 14, further reaching the CPU 19 as signal 18. Dependent on the light clock, for example, exceptions or defined warm resets are performed which are then treated as information by the operating system of the CPU 19.

Figure 6:
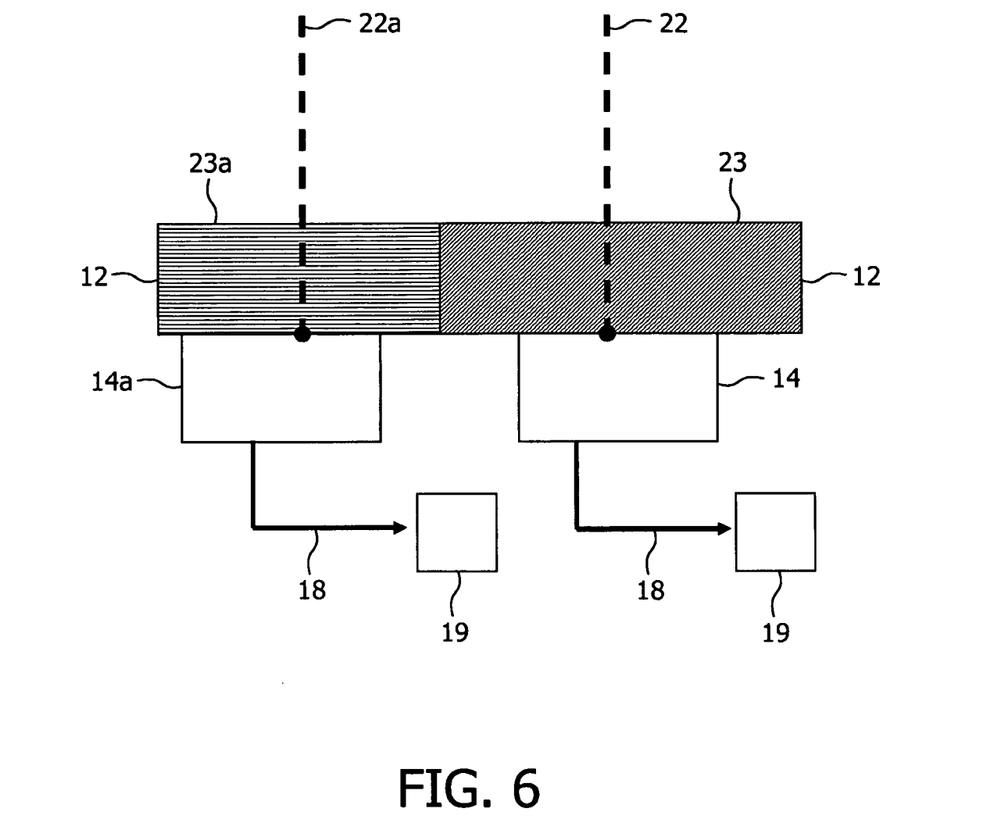
FIG. 6 shows diagrammatically the plurality of chip sensors according to the invention, with two photosensors.

The plurality of chip sensors shown in FIG. 6 includes at least two photosensors 14, 14a whose filter material is different, the filter material consisting of card material 23, in which a pulsed laser beam 22, 22a penetrates through the filter material and excites the photosensors 14, 14a which separately pass on a signal 18 to the CPU 19.

Based on the different equipment/doping of the card material 23, the photosensors 14, 14a are sensitized for different wavelengths. In this example, the card material 23a is doped with an ytterbium phosphate and formed in such a way that it is transparent at wavelengths of less than 800 nm and substantially opaque at wavelengths of more than 800 nm. A photosensor 14a detects the excitation 12 of a pulsed laser beam 22a (wavelength 650 nm) and converts it into a signal 18 for the CPU 19, which signal is utilized to enable the second photosensor which can now detect the excitation 12 of a pulsed laser beam 22 at a wavelength of 980 nm. In this way, information is divided between different photosensors 14, 14a, with the result that a ternary logic can be implemented.

LIST OF REFERENCE NUMERALS

100 data carrier
10 chip
11 plurality of chip sensors
12 excitation
13 energy
14 photosensor
14a photosensor
15 temperature sensor
16 frequency sensor
17 sensor
18 signal
19 CPU
20 antenna
21 antenna periphery
22 pulsed laser beam
22a pulsed laser beam
23 card material
23a ytterbium phosphate card material
24 matrix
25 UC converter
26 UC radiation
27 interference filter laminate
28 light converter
29 luminescence
30 electromagnetic field
31 luminescence emission

The invention claimed is:

1. A data carrier with a chip, which stores energy as well as information for contact-bound or contactless inductive communication, and with a plurality of excitable chip sensors integrated in the chip, which, after excitation, pass on a signal from the plurality of chip sensors to a central processing unit (CPU) of the chip, in which the signal is processed, characterized in that, independently of storing energy as well as information by the chip, the excitation is specifically adjustable by the chip for the purpose of additionally storing information and is adaptable to the requirements of processing the signal in the CPU, characterized in that the plurality of chip sensors communicates with a filter material in which the excitation is specifically adjustable and is adaptable to the requirements of processing the signal in the CPU;

characterized in that the plurality of chip sensors includes a photosensor and the filter material comprises a card material and a matrix adjoining the card material, which matrix generates modulated luminescences, in which a pulsed laser beam first penetrates through the card material and then penetrates the matrix, wherein the card material is separate and distinct from the matrix; and characterized in that the CPU performs a combined processing operation on a signal of the contact-bound or contactless inductive communication and the signal supplied by the plurality of chip sensors, wherein the signal of the contact-bound or contactless inductive communication is a binary value received via the contact-bound or contactless inductive communication and the signal supplied by the plurality of chip sensors is a binary value received via the photosensor; and wherein the CPU composes a binary code, which triggers a further process in the chip, from the binary value received via the contact-bound or contactless inductive communication and the binary value received via the photosensor.

2. A data carrier as claimed in claim 1, characterized in that the data carrier is integrated in a value or security document.

3. A method of communicating with chips integrated in data carriers, in which energy as well as information from a chip is stored for contact-bound or contactless inductive communication, the method comprising:

exciting a plurality of chip sensors integrated in the chip;

supplying a signal from the plurality of chip sensors to a central processing unit (CPU) for the purpose of processing, the excitation being specifically adjusted by the chip for the purpose of additional storage of information and being adapted to the requirements of processing in the CPU;

causing the plurality of chip sensors to communicate with a filter material in which the excitation is specifically adjusted and adapted to the requirements of processing the signal in the CPU;

characterized in that the plurality of chip sensors includes a photosensor and the filter material comprises a card material and a matrix adjoining the card material, which matrix generates modulated luminescences, in which a pulsed laser beam first penetrates through the card material and then penetrates the matrix, wherein the card material is separate and distinct from the matrix; and performing, with the CPU, a combined processing operation on a signal of the contact-bound or contactless inductive communication and the signal supplied by the plurality of chip sensors, wherein the signal of the contact-bound or contactless inductive communication is a binary value received via the contact-bound or contactless inductive communication and the signal supplied by the plurality of chip sensors is a binary value received via the photosensor; and composing, with the CPU, a binary code, which triggers a further process in the chip, from the binary value received via the contact-bound or contactless inductive communication and the binary value received via the photosensor.

4. A method as claimed in claim 3, characterized in that a photosensor detecting the excitation of a pulsed laser beam is integrated in the plurality of chip sensors.

\* \* \* \* \*